United States Patent
Garnett et al.

(10) Patent No.: US 6,858,796 B1
(45) Date of Patent: Feb. 22, 2005

(54) GROUNDING MECHANISM RETENTION FEATURE

(75) Inventors: Paul Jeffrey Garnett, Camberley (GB); Jay Kevin Osborn, Crowthorne (GB); Graham Bestwick, Newbury (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/673,695

(22) Filed: Sep. 29, 2003

(51) Int. Cl.[7] .............................................. H05K 9/00
(52) U.S. Cl. ................. 174/35 C; 174/35 GC; 361/719
(58) Field of Search .................. 174/35 R, 35 GC, 174/35 C; 361/816, 818, 719

(56) References Cited

U.S. PATENT DOCUMENTS

| | | | |
|---|---|---|---|
| 5,717,577 A | * 2/1998 | Mendolia et al. | 361/818 |
| 5,742,488 A | * 4/1998 | Lonka et al. | 361/816 |
| 6,205,026 B1 | 3/2001 | Wong et al. | 361/704 |
| 6,208,527 B1 | 3/2001 | McMahon et al. | 361/801 |
| 6,243,265 B1 | 6/2001 | Wong et al. | 361/704 |
| 6,310,773 B1 | 10/2001 | Yusuf et al. | 361/704 |
| 6,590,784 B2 | 7/2003 | Wortman et al. | 361/816 |
| 6,608,766 B2 | 8/2003 | Wortman et al. | 361/818 |

* cited by examiner

Primary Examiner—Hung V. Ngo
(74) Attorney, Agent, or Firm—Meyertons Hood Kivlin Kowert & Goetzel, P.C.; B. Noël Kivlin

(57) ABSTRACT

An electromagnetic (EM) shielding assembly includes an electrically conductive shielding portion and one or more electrically conductive protrusions for engaging with respective conductive apertures in a circuit board. The electrically conductive protrusions can be in electrical communication with the EM shielding portion. The protrusions can enable the EM shielding assembly to be attached to a circuit board in a computer system while also providing an electrical connection to logical ground. Further components, for example a heat sink that may be in electrical communication with the EM shielding portion, may thereby also be connected to logical ground.

12 Claims, 7 Drawing Sheets

US 6,858,796 B1

GROUNDING MECHANISM RETENTION FEATURE

BACKGROUND OF THE INVENTION

The present invention relates to electromagnetic (EM) shielding in computer systems. In particular, the invention relates to the physical attachment of an EM shielding cage to a circuit board and further to the electrical connection of an EM shielding cage to a desired voltage level.

Shielding cages can be provided in computer systems for providing electromagnetic shielding for components of the computer system such as a microprocessor. Where the component to be shielded is mounted upon a circuit board in the computer system, the shielding cage can be mounted upon the circuit board. The shielding cage can also be electrically connected to a predetermined voltage level (for example an earth voltage) so as to facilitate effective shielding. This can be achieved by means of a springy leg on the shielding cage that can contact a grounded pad on the circuit board, when the shielding cage is sandwiched between a heatsink and the circuit board.

However, with such an arrangement, the positioning of the springy legs is not well controlled and can be problematic, particularly in dense circuit board layouts. Also, the shielding cage is not firmly located whereby poor thermal contact between the heatsink and components of the computer system can result, leading to potential thermal failure.

SUMMARY OF THE INVENTION

One aspect of the invention can provide an electromagnetic (EM) shielding assembly for a computer system. The assembly can comprise an electrically conductive shielding portion for providing EM shielding for a component of the computer system. The assembly can also comprise at least one electrically conductive protrusion for engaging with an aperture in a circuit board. The electrically conductive protrusion can be in electrical communication with the shielding portion.

By engaging with a conductive aperture in the circuit board, secure mounting of the shielding assembly can be provided and an electrical connection for the shielding assembly can also be provided.

Another aspect of the invention can provide a computer system comprising a circuit board with a conductive aperture, an electrical component mounted on the circuit board, and an EM shielding assembly. The EM shielding assembly can comprise an electrically conductive shielding portion for providing EM shielding for the electrical component. The EM shielding assembly can also comprise an electrically conductive protrusion engaging with the conductive aperture. The electrically conductive protrusion can be in electrical communication with the shielding portion.

A further aspect of the invention can provide a method of providing electromagnetic (EM) shielding for a component of a computer system. The method can comprise providing an EM shielding assembly comprising an electrically conductive shielding portion and an electrically conductive protrusion in electrical communication with the shielding portion. The method can also comprise engaging the electrically conductive protrusion with a conductive aperture in a circuit board of the computer system.

BRIEF DESCRIPTION OF THE DRAWINGS

Embodiments of the present invention will be described hereinafter, by way of example only, with reference to the accompanying drawings in which like reference signs relate to like element sand in which:

FIG. 1b shows another view of the EM shielding assembly shown in FIG. 1a;

FIG. 2b shows a side view of the protrusion and printed circuit board (PCB) shown in FIG. 2a;

FIG. 3b shows a side view of the protrusion and PCB shown in FIG. 3a;

FIG. 4b shows another view of the protrusion and PCB shown in FIG. 4a;

FIG. 5b shows a side view of the protrusion and PCB shown in FIG. 5a;

Figure 1A:
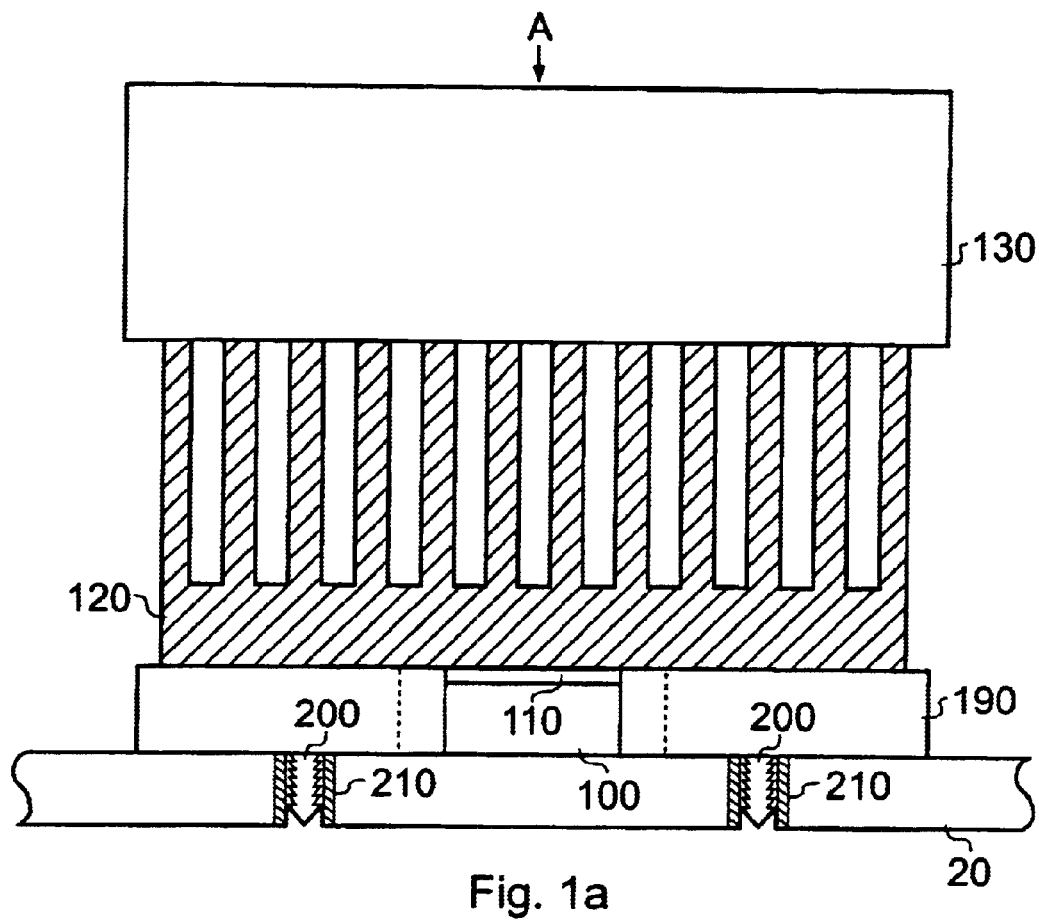
FIG. 1a shows an EM shielding assembly with connecting/attaching protrusions in accordance with an embodiment of the invention.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternative falling within the spirit and scope of the present invention as defined by the appended claims. In this regard, combinations of features from the independent claims with features of dependent claims other than as presented by the dependencies of the claims, and also with features from the description, are envisaged.

DESCRIPTION OF PARTICULAR EMBODIMENTS

Figure 1B:
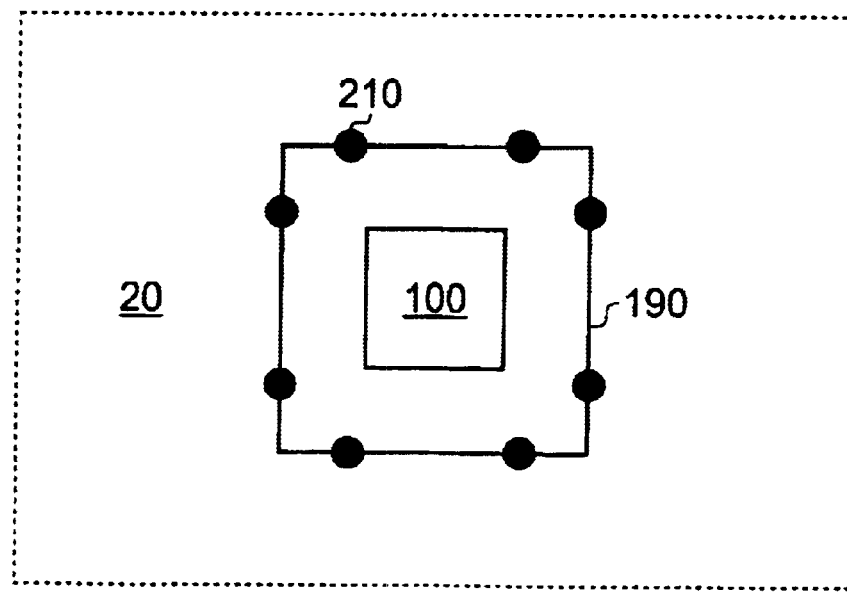

FIGS. 1a and 1b are schematic representations of an example of a shielding assembly. The shielding assembly provides EM shielding for a component (such as a processor chip or "CPU" 100) mounted upon the surface of a circuit board such as a PCB 20. Although a CPU 100 is illustrated in this example, it will be appreciated the component could be any component that it is desired to shield. FIG. 1 also illustrates a heatsink 120 and fan unit 130 that may be provided in order to provide cooling for the CPU 100. The shielding assembly comprises a shielding cage 190 that surrounds the periphery of the CPU 100. In FIG. 1a, a portion of the shielding cage 190 indicated by the dashed lines has been cut away in order to show the configuration of the CPU 100 with respect to the remaining components of the assembly. Also shown is a thermal contact 110 that may be provided to improve thermal contact between the CPU 100 and the heatsink 120 (where one is provided). The thermal contact 110 may, for example, comprise thermal grease. In cases where no heatsink is provided, the shielding cage 190 may extend over and above the CPU 100 in order that full EM shielding is provided. While in FIG. 1a it is shown that the shielding cage 190 abuts the surface of the PCB 20, it is envisaged that a gap may be left between the shielding cage 190 and the PCB surface, perhaps to facilitate additional cooling or in order to provide space for any further components or connections in the vicinity of the CPU 100.

The shielding cage 190 can be formed from one or more electrically conductive materials, for example a metal or metals such as such as copper, copper alloys, stainless steel, gold or aluminum, or can be formed from a non-conductive material (e.g., plastics) with, for example, a conductive coating (e.g., a metal or metals).

The PCB 20 is provided with a number of apertures including at least one conductive aperture such as a plated-through-hole 210. An inner surface of each plated-through-hole 210 can be coated with an electrically conductive material such as copper or gold. The apertures pass through the PCB 20. Each aperture may for example be circular in cross section, although other cross sectional shapes are envisaged (rectangular, square, irregular, etc.). In use, one or more conductive apertures can be maintained at a desired voltage level. For example, where a conductive aperture comprises a plated-through-hole 210, the metallic surface of the plated-though-hole 210 can be maintained at the desired voltage level. The desired voltage level may, for example, be a voltage corresponding to logic ground for the CPU 100.

The shielding assembly further comprises a number of protrusions 200, each of which are located within a respective aperture. At least one protrusion 200 can be made from or coated with an electrically conductive material and can be in electrical communication with the shielding cage 190. Each protrusion 200 may, for example, be integrally formed with the shielding cage 190 and thereby comprise the same material or construction as the shielding cage 190. Alternatively, protrusions 200 may be constructed separately and attached to the shielding cage 190, by welding, brazing or riveting for example.

When in place, a protrusion 200 can engage with a conductive aperture thereby achieving an electrical connection between the desired voltage level and the shielding cage 190. For example, where the conductive aperture is a plated-through-hole 210, a protrusion 200 can contact the inner conductive surface of the plated-through-hole 210 within which it is located.

Holding the shielding cage 190 at a desired voltage level (such as a voltage level corresponding to logic ground for the CPU 100) ensures that effective EM shielding for the CPU 100 is provided.

The shielding cage 190 may also be in electrical communication with a heat sink 120 (if provided), thereby providing a g round connection for the heatsink 120. In such cases, the heatsink 120 itself may serve to provide a degree of EM shielding, particularly in the region above the CPU 100. The heatsink 120 mayor may not be physically attached to the shielding cage 190. The heatsink 120 may comprise a separate, direct attachment (such as a screw attachment) to the PCB 20, thereby providing additional stability for the assembly.

As well as providing an electrical connection to a desired voltage level, the protrusions 200 can also serve to physically attach the shielding cage 190 to the PCB 20. In the example shown in FIG. 1a, each protrusion 200 comprises a number of barbs. The barbs can provide purchase for each protrusion 200 on an inner surface of its associated aperture or plated-through-hole 210. The additional grip provided by the barbs can also ensure that good electrical contact between the inner conductive surface of a plated-through-hole 210 and a protrusion 200 is maintained The use of the protrusions 200 thereby provides a means by which the shielding cage 190 may be secured to the surface of the PCB 20 while also providing an electrical connection to a desired voltage level. The dual role played by the protrusions 200 leads to a reduction in the number of connections required since it is not necessary that separate connections be employed to effect electrical connections and physical attachments. The amount of space occupied near the surface of the PCB 20 is thereby reduced.

Since an electrical connection formed by a protrusion 200 can be located primarily in the vicinity of a conductive aperture with which that protrusion 200 is engaged (for example on the inner conductive surface of a plated-through-hole 210), there is little chance that the protrusions may 'wander' over the surface of the PCB 20 during assembly (as has been described above in relation to the use of sprung legs for electrical connections). Also, by combining the means that provide electrical connection and physical attachment of the shielding cage 190 to the PCB 20 in a single element, the electrical connection is held firmly in place.

In contrast to the use of soldering, the use of protrusions 200 provides a physical attachment which is unlikely to come loose, but which can be easy to assemble and disassemble. To mount the shielding cage 190 upon a PCB 20, each protrusion 200 of the shielding assembly is inserted into a respective aperture. To remove the shielding cage 190, each protrusion 200 of the shielding assembly is withdrawn from its respective aperture. The shielding assembly is thereby easily removable and indeed reusable.

FIG. 1b shows a view of the shielding assembly along the direction shown by arrow A in FIG. 1a. In order that the configuration of the CPU 100 with respect to the shielding cage 190 is shown clearly, the heatsink 120 and fan unit 130 are not shown in FIG. 1b. The PCB 20 is represented only schematically in FIG. 1b and may in fact extend well beyond the outline shown by the dotted line. FIG. 1b shows that the shielding cage 190 surrounds the periphery of the CPU 100. FIG. 1b also shows an example of how protrusions 200 and respective apertures and conductive apertures such as plated-through-holes 210 may be distributed around the shielding cage 190 to provide effective physical attachment and/or electrical connection for the shielding cage 190. While in the present example eight such protrusions are used, it is envisaged that any number of protrusions may be provided in accordance with system requirements. Also, as will be apparent from the above, at least one protrusion 200 and one corresponding aperture should be a conducting protrusion 200 and a conductive aperture (such as a plated-through-hole 210) respectively, to enable the connection of the shielding assembly to the desired voltage level via the conductive aperture. In a specific embodiment one, more or all of the protrusions 200 can be conductive protrusions and one, more or all of the apertures can be conductive apertures.

The protrusions can have alternative forms, various examples of which will now be described with reference to FIGS. 2 to 6.

Figure 2A:
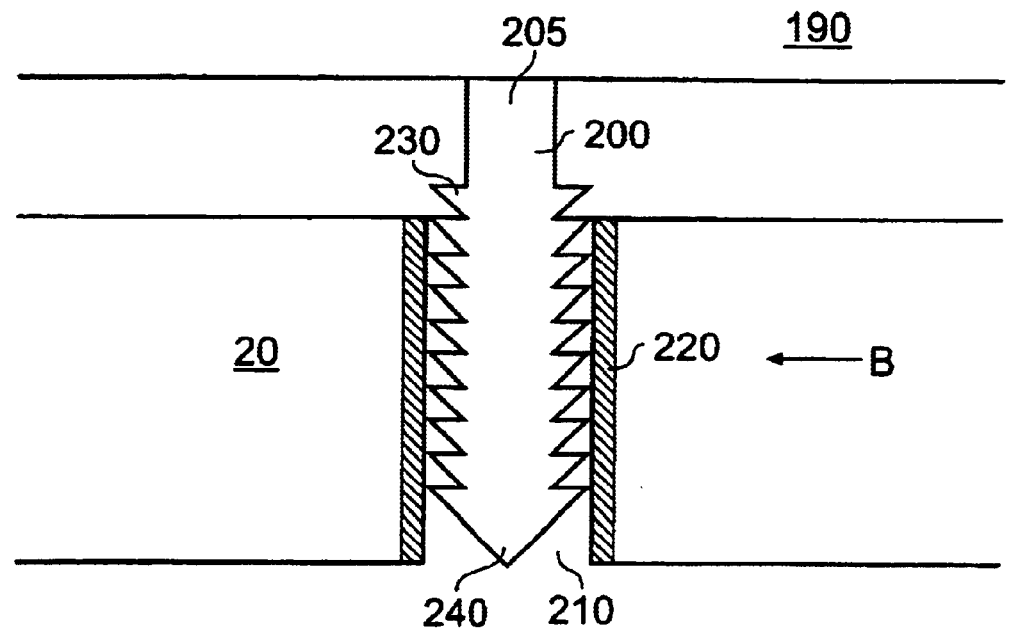
FIG. 2a shows an example of a connecting/attaching protrusion in accordance with an embodiment of the invention.
Figure 2B:
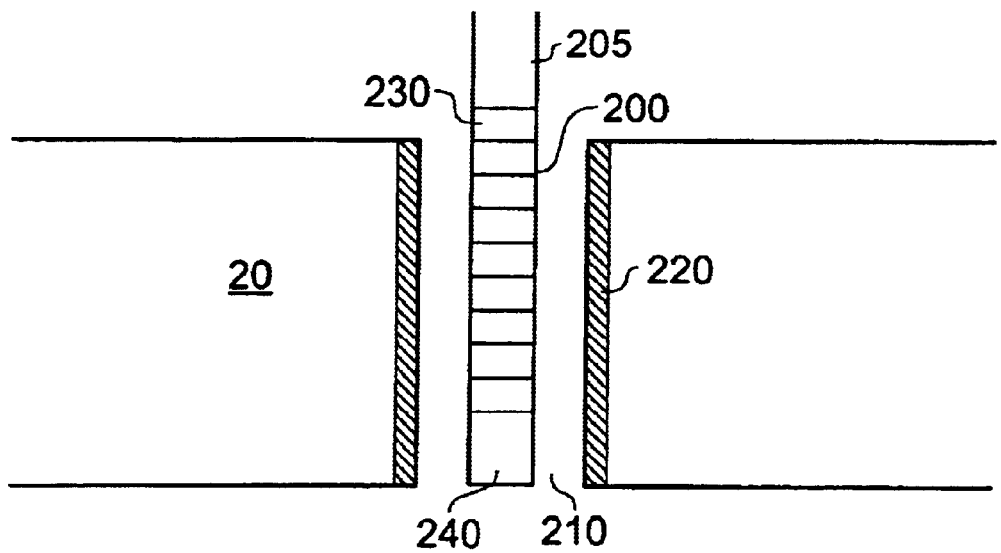

FIGS. 2a and 2b show in detail a protrusion 200 similar to those used in conjunction with the example shown in FIG.

1. FIG. 2b shows a view of the protrusion 200 along the direction shown by arrow B in FIG. 2a. The protrusion 200 is substantially planar, as may be appreciated by comparison of FIG. 2b with FIG. 2a. The protrusion 200 comprises a number of barbs which form two serrated edges 230. The barbs abut with and grip onto the inner plated surface 220 of the plated-through-bole 210.

Figure 3A:
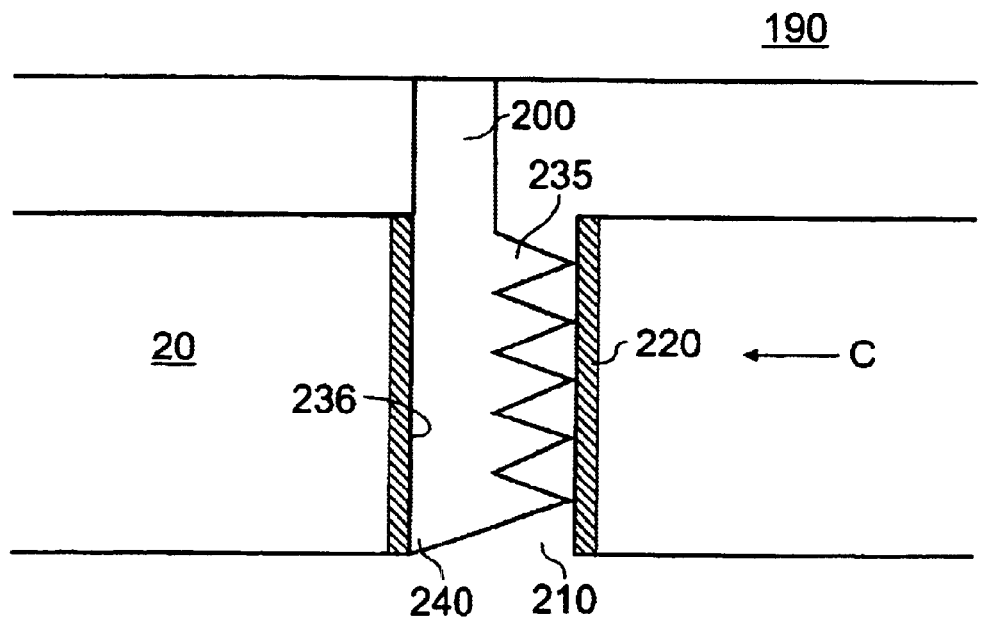
FIG. 3a shows another example of a connecting/attaching protrusion in accordance with an embodiment of the invention.
Figure 3B:
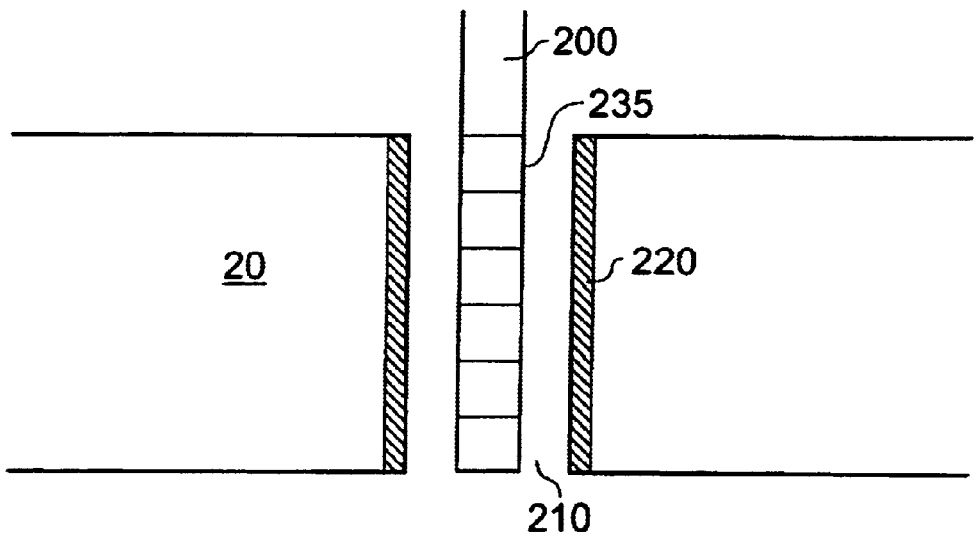

Another example of a protrusion 200 is shown in FIGS. 3a and 3b. FIG. 3b shows a view of the protrusion 200 along the direction shown by arrow C in FIG. 3a The protrusion 200 shown in these Figures comprises barbs that form a single serrated edge 235. The protrusion 200 also has a flat edge 236. The flat edge 236 abuts the inner plated surface 220 of the plated-through-hole 210 with a larger surface area than is provided by a serrated edge and a better electrical contact is thereby provided. Nevertheless, the barbs ensure that sufficient grip is provided to secure the protrusion 200 within the plated-through-hole 210 thereby keeping the shielding cage 190 in place. Thus by providing a combination of flat edges and barbs forming serrated edges, both a good electrical contact and a robust physical attachment for the shielding cage 190 can be provided.

Figure 4A:
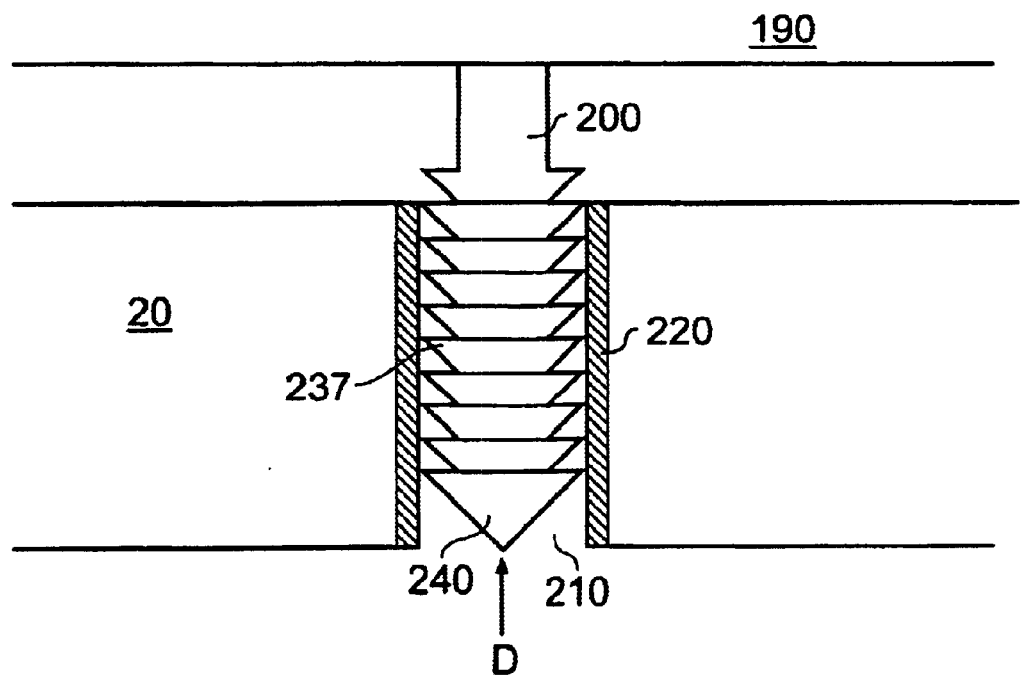
FIG. 4a shows a further example of a connecting/attaching protrusion in accordance with an embodiment of the invention.
Figure 4B:
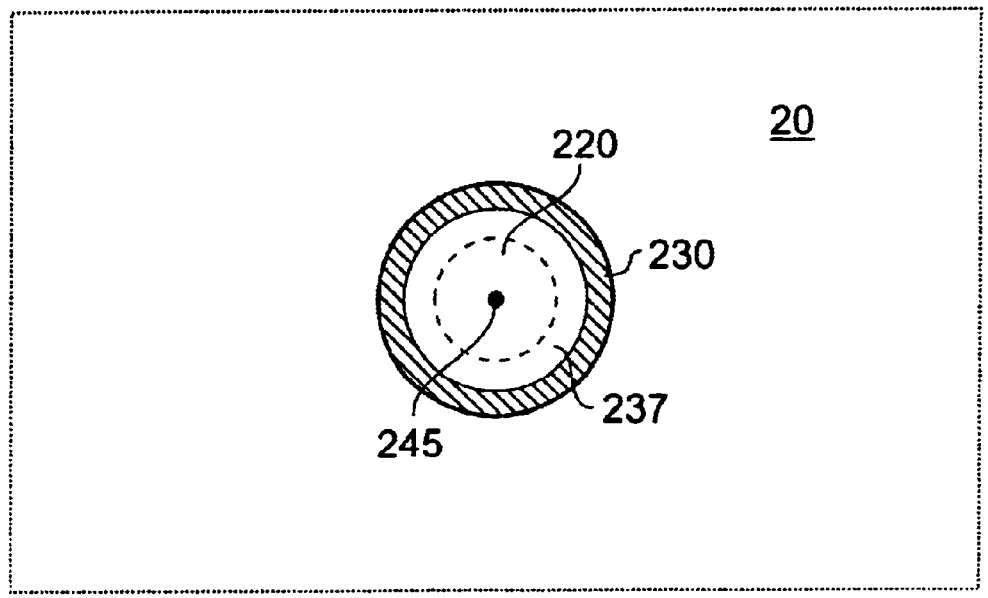

A further example of a type of protrusion 200 is shown in FIGS. 4a and 4b. FIG. 4b shows a view of the protrusion 200 along the direction shown by arrow D in FIG. 4a The lower surface of the PCB 20 is represented only schematically in FIG. 4b and may in fact extend well beyond the outline shown by the dotted line.

In this example, the protrusion 200 is substantially cylindrical with a serrated edge 237 formed from a series of ridges located on the curved surface of the cylinder. Since the protrusion 200 has the same cross-sectional profile as the plated-through-hole 210, physical contact between the serrations and the inner plated surface 220 is maximized, whereby a more effective electrical contact and additional grip are provided.

In each of the examples shown in FIGS. 2 to 4, the protrusion 200 comprises a non-serrated portion located in the region where the protrusion 200 meets the shielding cage 190. This non-serrated portion is not required but may be provided to act as a spacer between the surface of the PCB 20 and the lower edge of the shielding cage 190. The protrusions 200 shown in the embodiments shown in FIGS. 1, 5 and 6 comprise no such spacer.

Figure 5A:
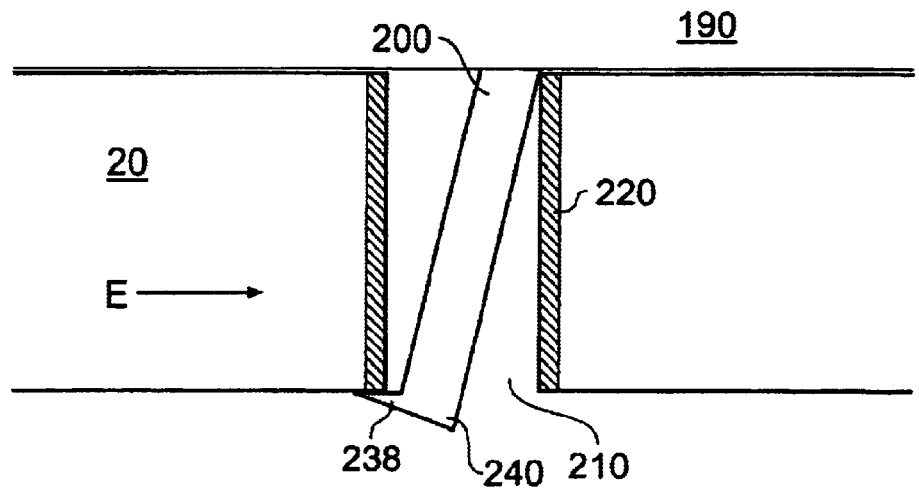
FIG. 5a shows a further example of a connecting/attaching protrusion in accordance with an embodiment of the invention.
Figure 5B:
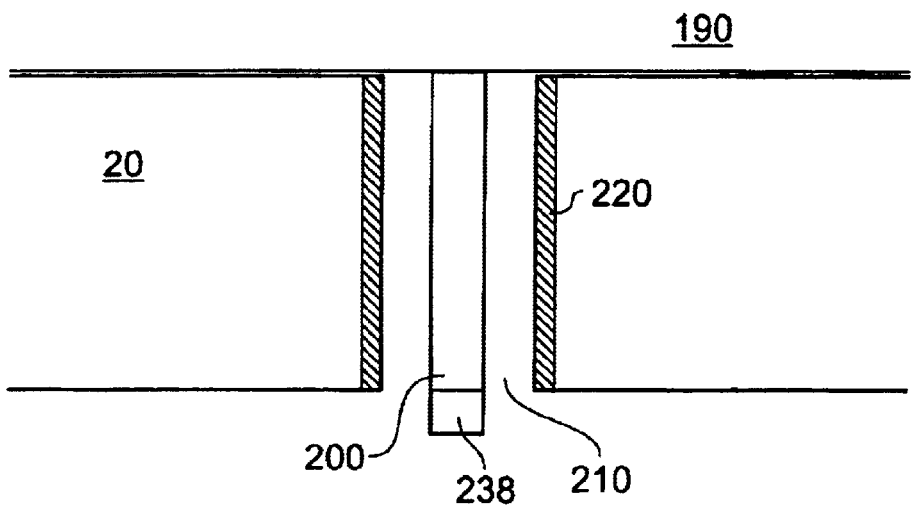

Another example of a protrusion 200 is shown in FIGS. 5a and 5b. FIG. 5b shows a view of the protrusion 200 along the direction shown by arrow E in FIG. 5a. The protrusion 200 shown in these Figures comprises a single barb 238. While in some embodiments, protrusions comprising a single barb may be configured such that the serration grips the inner surface 220 of a plated-through-hole 210, in the examples shown in FIGS. 5a and 5b, the barb 238 is configured to form a latching portion for latching onto the underside of the PCB 20. By latching onto the underside of the PCB 20, the protrusion 200 serves to hold the shielding cage 190 in place while also providing a degree of contact with the inner plated surface 220.

As is shown in FIG. 5a, the protrusion 200 may be configured to slant to one side as it extends away from the shielding cage 190. Once inserted within an aperture, the slanting of the protrusion 200 ensures that the protrusion presses against opposite sides of the aperture whereby the protrusion 200 is held securely in place. The shielding cage 190 is thereby held securely in place and a persistent electrical connection between the shielding cage 190 and the inner plated surface 220 of the plated-through-hole 210 is provided.

Figure 6:
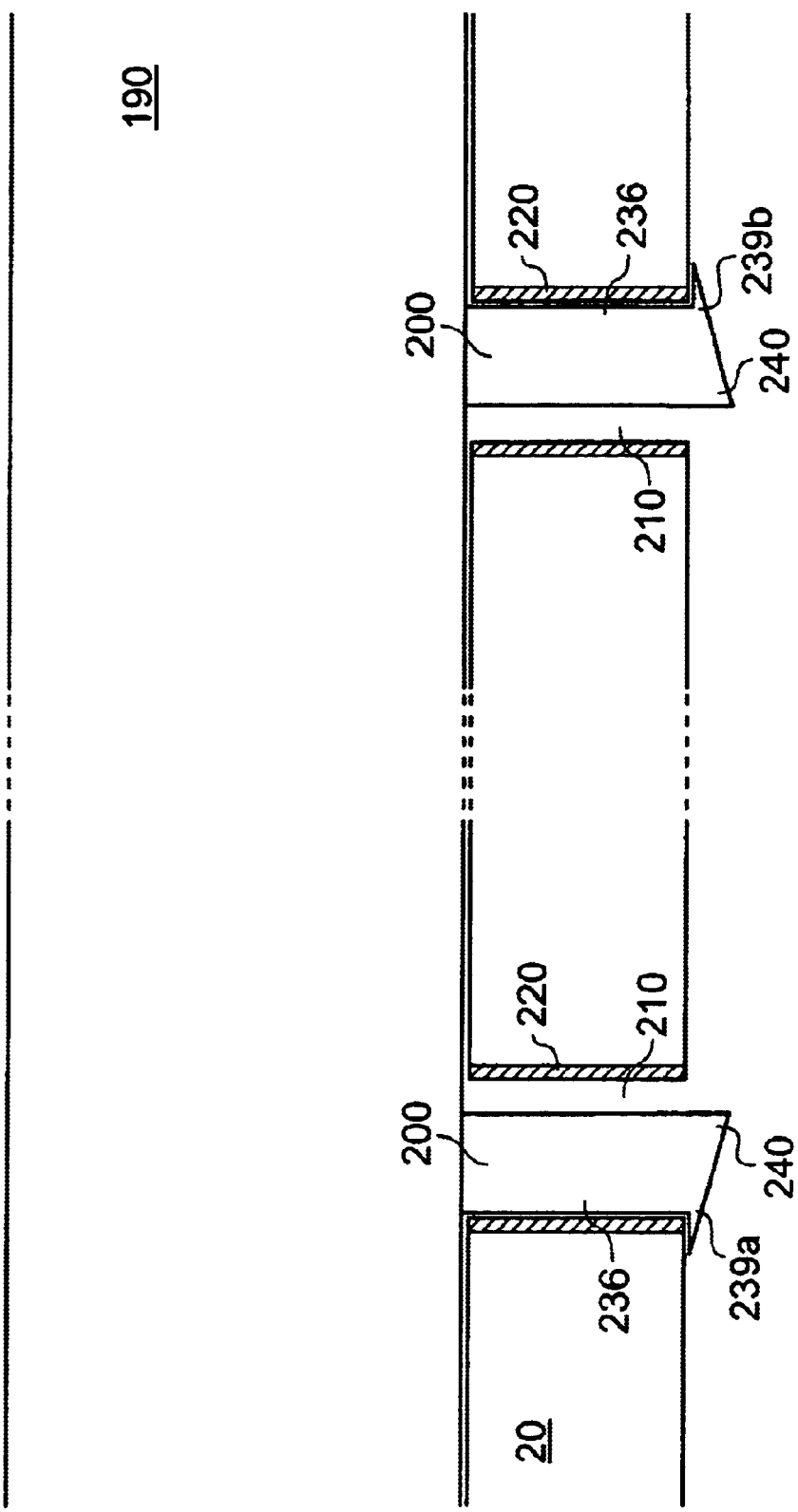
FIG. 6 shows an arrangement of connecting/attaching protrusions and a PCB in accordance with an embodiment of the invention.

FIG. 6 shows a further example in which protrusions 200 comprising a single barb are provided. In this example, each protrusion 200 extends away from the shielding cage 190 in a non-slanted configuration such that a flat edge 236 of each protrusion 200 abuts the inner plated surface 220 of a respective plated-through-hole 210. A good electrical contact between the plated-through-holes 210 and the protrusions 200 is thereby ensured.

The barbs 239a and 239b of the two protrusions 200 shown in FIG. 6 are aligned such that they point along opposite directions. Indeed, the barbs 239 of each protrusion 200 are configured to latch onto the underside of the PCB 20 beneath the flat edge 236 which contacts the inner plated surface 220 of the respective plated-through-hole 210. This arrangement ensures that lateral movement of the protrusions 200 within their respective plated-through-holes 210 is minimized since the flat edge 236 of each protrusion 200 prevents the flat edge 236 of another protrusion 200 from moving away from the respective inner plated surface 220 which it abuts. Accordingly, the flat edges 236 are pressed against the inner plated surfaces 220 of the their respective plated-through-holes 210 whereby a good electrical contact between the two is maintained. In other examples, the barbs 239a and 239b may be aligned such that they point toward each other. In some examples, the flat edges 236 may abut the inner plated surfaces 220 of their respective plated-through-holes 210 such that the protrusions 200 'pinch' the PCB 20 and grip onto the section of PCB 20 which lies between the respective plated-through-holes 210.

As illustrated, the protrusions 200 described herein may have an end distal to the shielding cage 190, which is tapered. Such a tapered end 240 may be provided to facilitate insertion of the protrusions 200 into their respective apertures during assembly.

In order further to facilitate insertion of protrusions 200 described herein into their respective apertures, the protrusions may be configured with a degree of resilience or flexibility to allow some lateral movement with respect to the shielding cage 190. This resilience, or flexibility, would find particular application for example in examples such as those described in relation to FIGS. 5 and 6 since otherwise insertion of such protrusions 200 might prove difficult.

In some examples, at least one of the barb or barbs of the protrusions 200 may be biased so as to ease insertion of the protrusions 200 into their respective apertures. Biasing of this kind can also make it to relatively difficult to remove the protrusion 200 from an aperture thereby providing additional stability for the shielding cage 190. The examples shown in FIGS. 1, 2 and 4 each comprise biased barbs. As can be seen most clearly in FIGS. 2a and 4a, the biasing can comprise a slanting of the barbs in a direction away from the direction in which the protrusion 200 is to be inserted within an aperture. No such biasing is employed in the example shown in FIG. 3.

The length of each protrusion 200 may be determined in accordance with the thickness of the PCB 20. For example, the protrusion lengths may be chosen such that the distal end of the protrusion 200 lies flush with, or recessed above, the lower surface of the PCB 190 when inserted. In the embodiments shown in FIGS. 5 and 6, the length of the protrusions can be chosen such that when the barbs latch on to the underside of the PCB 20, the lower portion of the shielding cage 190 abuts the surface of the PCB 20.

Figure 7:
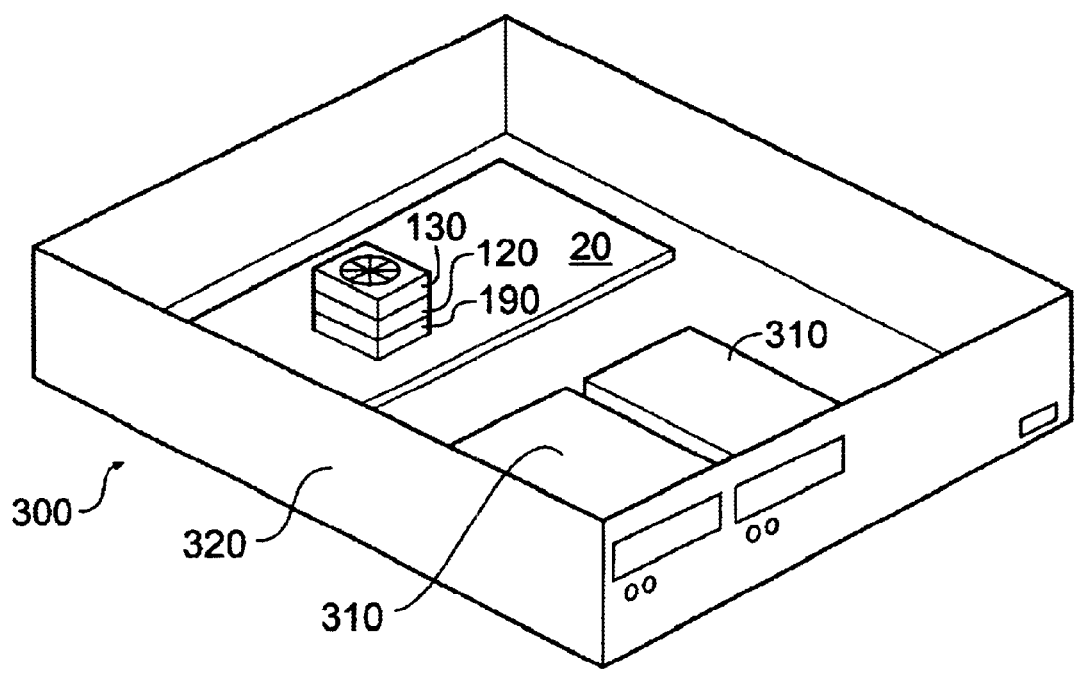
FIG. 7 shows a shielding assembly installed upon a PCB of a computer system in accordance with an embodiment of the present invention.

FIG. 7 shows a computer system 300 comprising a chassis 320, a PCB 20 (for example a motherboard) and additional components such as media drives 310. Mounted upon the PCB 20 are a CPU 100 (not shown) and a shielding assembly in accordance with an embodiment of the present invention. Also provided are a heatsink 120 and a fan unit 130. The shielding cage 190 of the shielding assembly is shown to be located between the PCB 20 and the heatsink 120, surrounding the periphery of the CPU 100.

Thus, there has been described an electromagnetic (EM) shielding assembly with an electrically conductive shielding portion and one or more electrically conductive protrusions for engaging with respective conductive apertures in a circuit board. The electrically conductive protrusion or protrusions can be in electrical communication with the EM shielding portion. The protrusion or protrusions enables the EM shielding assembly to be attached to a circuit board in a computer system while also providing an electrical connection, for example to logical ground. Further components, for example a heat sink, which are in electrical communication with the EM shielding portion may thereby also be provided with a connection to logical ground.

The engagement of the protrusion with the aperture can be achieved in various ways. Various configurations have been described above. For example, a tapered end may facilitate insertion of the protrusion into an aperture in the circuit board. A flat edge to the protrusion for abutting an electrically conductive surface defining the conductive aperture can provide an electrical contact between the protrusion and the electrically conductive surface. A latching portion of the protrusion can be provided for latching onto the underside of the circuit board. Alternatively, or in addition, one or more barbs of the protrusion can be provided for engaging with a surface defining the aperture. Such a barb or barbs can be used to enhance electrical contact and/or mechanical securing of the protrusion within the aperture. The barb or barbs may be biased for facilitating insertion of the electrically conductive protrusion into the aperture. The protrusion can have various cross-sections. For example the protrusion may be substantially planar. In an alternative example, it may be substantially cylindrical. It should be appreciated, however, that these are merely examples of possible configurations of the protrusions, and that other configurations can be envisaged within the scope of the claimed invention.

Thus, although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An electromagnetic (EM) shielding assembly for a computer system, the assembly comprising:
   an electrically conductive shielding portion configured to provide EM shielding for a component of the computer system; and
   at least one electrically conductive protrusion in electrical communication with the shielding portion and comprising a serrated edge for engaging with an inner surface of a conductive aperture in a circuit board to secure the shielding assembly to the circuit board.

2. The EM shielding assembly of claim 1, wherein the protrusion is formed integrally with the electrically conductive shielding portion.

3. The EM shielding assembly of claim 1, wherein the electrically conductive protrusion comprises a tapered end.

4. The EM shielding assembly of claim 1, wherein the electrically conductive protrusion comprises a flat edge configured to abut an electrically conductive surface defining said aperture.

5. The EM shielding assembly of claim 1, wherein said protrusion comprises a latching portion configured to latch onto the underside of the circuit board.

6. The EM shielding assembly of claim 1, wherein said serrated edge comprises one or more barbs or serrations configured to engage with the inner surface.

7. The EM shielding assembly of claim 1, wherein the serrated edge is biased to facilitate insertion of the electrically conductive protrusion into said conductive aperture.

8. The EM shielding assembly of claim 1, wherein the electrically conductive protrusion is substantially cylindrical.

9. The EM shielding assembly of claim 1, wherein the protrusion is configured to slant away from the shielding portion.

10. A computer system comprising a circuit board with a conductive aperture, an electrical component mounted on the circuit board, and an EM shielding assembly comprising:
    an electrically conductive shielding portion configured to provide EM shielding for the electrical component; and
    an electrically conductive protrusion in electrical communication with the shielding portion and comprising a serrated edge engaged with an inner surface of the conductive aperture for securing the shielding assembly to the circuit board.

11. A method of providing electromagnetic (EM) shielding for a component of a computer system, the method comprising:
    providing an EM shielding assembly comprising an electrically conductive shielding portion and an electrically conductive protrusion in electrical communication with the shielding portion, the protrusion comprising a serrated edge for engaging with an inner surface of a conductive aperture in a circuit board of the computer system; and
    securing the shielding assembly to the circuit board, wherein the securing comprises engaging the serrated edge with the conductive aperture.

12. An electromagnetic (EM) shielding assembly for a computer system, the assembly comprising:
    electrically conductive shielding means for providing EM shielding for a component of the computer system; and
    electrically conductive protrusion means in electrical communication with the shielding means and comprising serrated edge means for engaging with an inner surface of a conductive aperture in a circuit board to secure the shielding assembly to the circuit board.

* * * * *